United States Patent
Zhang et al.

(10) Patent No.: US 12,424,340 B2
(45) Date of Patent: Sep. 23, 2025

(54) MULTIPURPOSE PASSIVE RESIDUAL HEAT REMOVAL SYSTEM FOR SMALL FLUORIDE-SALT-COOLED HIGH-TEMPERATURE REACTOR

(71) Applicant: XI'AN JIAOTONG UNIVERSITY, Shaanxi (CN)

(72) Inventors: Dalin Zhang, Shaanxi (CN); Xindi Lv, Shaanxi (CN); Xin Min, Shaanxi (CN); Chenglong Wang, Shaanxi (CN); Wenxi Tian, Shaanxi (CN); Suizheng Qiu, Shaanxi (CN); Guanghui Su, Shaanxi (CN)

(73) Assignee: XI'AN JIAOTONG UNIVERSITY, Shaanxi (CN)

( * ) Notice: Subject to any disclaimer, the term of this patent is extended or adjusted under 35 U.S.C. 154(b) by 278 days.

(21) Appl. No.: 17/893,962

(22) Filed: Aug. 23, 2022

(65) Prior Publication Data
US 2023/0386688 A1    Nov. 30, 2023

(30) Foreign Application Priority Data
Aug. 30, 2021    (CN) .......................... 202111007616.8

(51) Int. Cl.
*G21C 15/18*    (2006.01)
*H10N 10/17*    (2023.01)
*H10N 10/852*    (2023.01)

(52) U.S. Cl.
CPC ............. *G21C 15/18* (2013.01); *H10N 10/17* (2023.02); *H10N 10/852* (2023.02)

(58) Field of Classification Search
CPC .......... G21C 15/18; G21C 15/185; G21D 7/04
See application file for complete search history.

(56) References Cited

U.S. PATENT DOCUMENTS

| | | | | |
|---|---|---|---|---|
| 2009/0245453 | A1* | 10/2009 | Jeong | G21C 15/18 376/299 |
| 2010/0260306 | A1* | 10/2010 | Hyde | G21D 7/04 376/299 |
| 2019/0237205 | A1* | 8/2019 | Abbott | G21C 1/03 |

OTHER PUBLICATIONS

Ho, M. K. M., G. H. Yeoh, and G. Braoudakis. "Molten salt reactors." Materials and Processes for Energy, Formatex (2013): 761-768. (Year: 2013).*

(Continued)

*Primary Examiner* — Sharon M Davis

(57) ABSTRACT

A multipurpose passive residual heat removal system for a small fluoride-salt-cooled high-temperature reactor is provided, including: a circulation loop composed of a reactor body system, a multipurpose passive residual heat removal system, pipes and other connecting equipment between each system; wherein the reactor body system serves as the heat source of the system, using helical cruciform fuel element and FLiBe molten salt coolant, wherein a thermal power is 125 MW, and a temperature of the core outlet reaches 700° C., which has the advantages of high-temperature and low-pressure operation, inherent safety and compact structure. The multipurpose passive residual heat removal system not only serves as a special safety facility to ensure the passive safety of the reactor, but also efficiently recovers and utilizes the residual heat through the thermoelectric power generation device for power generation.

9 Claims, 1 Drawing Sheet

(56) References Cited

OTHER PUBLICATIONS

Wang, Dongqing, Jin Jiang, and Yu Liu. "A thermoelectric generator based efficiency booster for performance enhancement of natural circulation systems." Nuclear Engineering and Design 320 (2017): 187-199. (Year: 2017).*

* cited by examiner

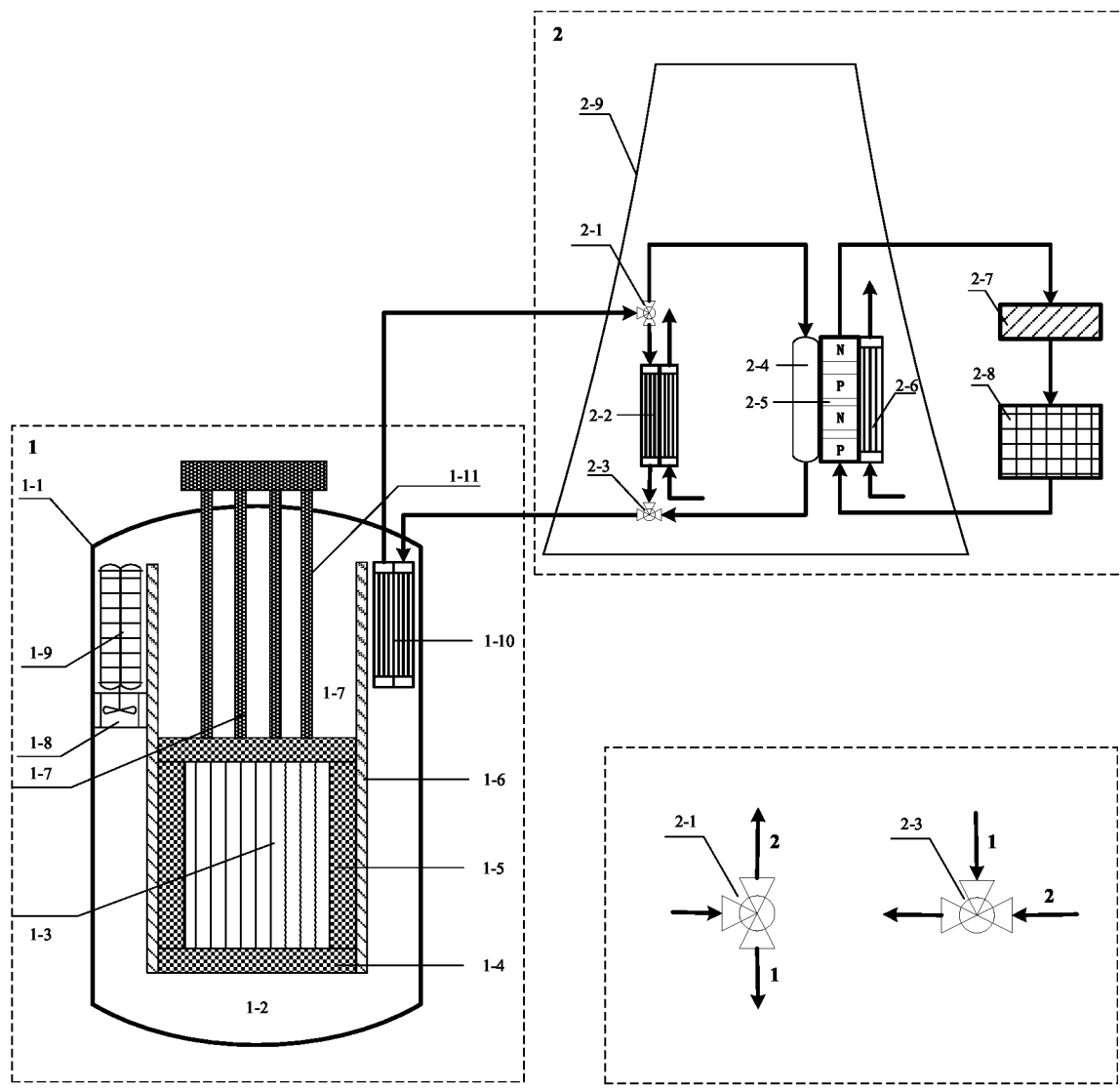

MULTIPURPOSE PASSIVE RESIDUAL HEAT REMOVAL SYSTEM FOR SMALL FLUORIDE-SALT-COOLED HIGH-TEMPERATURE REACTOR

CROSS REFERENCE OF RELATED APPLICATION

The present application claims priority under 35 U.S.C. 119(a-d) to CN 202111007616.8, filed Aug. 30, 2021.

BACKGROUND OF THE PRESENT INVENTION

Field of Invention

The present invention relates to the technical field of advanced nuclear energy safety development and energy utilization, and more particularly to a multipurpose passive residual heat removal system for a small fluoride-salt-cooled high-temperature reactor.

Description of Related Arts

Small fluoride-salt-cooled high-temperature reactors have the characteristics of high-temperature and low-pressure operation, nuclear nonproliferation, inherent safety and compact structure. In recent years, researches on the small fluoride-salt-cooled high-temperature reactors are being carried out steadily.

However, the design schemes for small fluoride-salt-cooled high-temperature reactors proposed at present mostly focus on the design of the core module, the design on the reactor structure, materials and related equipment, especially the combined research on the passive residual heat removal system for its special safety facilities is insufficient.

The passive residual heat removal system is applied for exporting the core heat of the reactor under emergency shutdown and accident conditions. However, in the normal operation of the reactor, in order to ensure that the high-temperature fluoride salt in the residual heat removal loop will not solidify, passive residual heat removal systems will always be in operation, causing heat loss from the core. Utilizing the huge temperature difference between high temperature fluoride salt and air, the passive residual heat removal system is combined with the thermoelectric power generation system to form a multipurpose passive residual heat removal system of small fluoride-salt-cooled high-temperature reactor. It can not only export the heat of the reactor core under emergency shutdown and accident conditions in time, but also effectively utilize the residual heat from the residual heat removal system in the reactor normal operation conditions, so as to provide an important reference for the safe development and energy utilization of the new generation nuclear energy systems.

SUMMARY OF THE PRESENT INVENTION

In order to overcome the above-mentioned problems in the existing technologies, the present invention discloses a multipurpose passive residual heat removal system for a small fluoride-salt-cooled high-temperature reactor, which provides specially designed safety facilities for the small fluoride-salt-cooled high-temperature reactor, and efficiently recycles and utilizes residual heat discharged from residual heat removal system to generate electricity.

In order to achieve the above objects, the present invention adopts the following technical solutions.

A multipurpose passive residual heat removal system for a small fluoride-salt-cooled high-temperature reactor, comprising: a reactor body system 1 and a multipurpose passive residual heat removal system 2;

wherein the reactor body system 1, which serves as a heat source for the temperature reactor, comprises: a reactor vessel 1-1, a molten salt cold pool 1-2, a core 1-3, a core axial reflector 1-4, a core radial reflector 1-5, a cold/hot pool coaming 1-6, a molten salt hot pool 1-7, an axial flow pump 1-8, an FLiBe-FLiNaK primary heat exchanger 1-9, an FLiBe-FLiNaK residual heat removal heat exchanger 1-10 and a control rod and drive mechanism 1-11; wherein the FLiBe-FLiNaK primary heat exchanger 1-9 and the FLiBe-FLiNaK residual heat removal heat exchanger 1-10 are provided in the upper part of the reactor vessel 1-1; the axial flow pump 1-8 is provided below the FLiBe-FLiNaK primary heat exchanger 1-9; the control rod and drive mechanism 1-11 are provided in the upper part of the core 1-3; the cold/hot pool coaming 1-6 is provided outside the core radial reflector 1-5, and separates the interior of the reactor vessel 1-1 into the molten salt cold pool 1-2 and the molten salt hot pool 1-7; the core radial reflector 1-5 is axially provided on the core; and the core axial reflectors 1-4 are respectively provided on an upper portion and a lower portion of the core 1-3;

wherein a working process of the reactor body system 1 is as follows: when the reactor body system 1 is in a normal operation, after transmitting by the axial flow pump 1-8, the FLiBe molten salt coolant is collected in the molten salt cold pool 1-2, then deflect upwards, enter the core 1-3 from the bottom of the core axial reflector 1-4 to absorb heat, and then collect in the molten salt hot pool 1-7 and flows downward from a top and enters the FLiBe-FLiNaK primary heat exchanger 1-9 and the FLiBe-FLiNaK residual heat removal heat exchanger 1-10 respectively, and the FLiBe-FLiNaK primary heat exchanger 1-9 releases heat to the secondary circuit system, and the FLiBe-FLiNaK residual heat removal heat exchanger 1-10 releases heat to the multipurpose passive residual heat removal system 2, and finally the FLiBe molten salt coolant flowing through the FLiBe-FLiNaK primary heat exchanger 1-9 enters the axial flow pump 1-8 to pressurize to complete a forced circulation of the coolant, and the FLiBe molten salt coolant flowing through the FLiBe-FLiNaK residual heat removal heat exchanger 1-10 directly enters the molten salt cold pool 1-10 at the bottom of the reactor vessel, so as to complete natural circulation of the coolant; in reactor shutdown and accident conditions, the coolant working process in the reactor body system 1 is the same as the forced circulation mode, except that the axial flow pump 1-8 does not work, but uses the driving force provided by the density difference between the cold fluid in the area of the FLiBe-FLiNaK removal heat exchanger 1-10 and the hot fluid in the core area to complete the natural circulation of the coolant;

wherein the multipurpose passive residual heat removal system 2, as a special safety facility for the multipurpose passive residual heat removal system of a small fluorine salt-cooled high temperature reactor, shares the FLiBe-FLiNaK residual heat removal heat exchanger 1-10 with the reactor body system 1, and further comprises a diverter valve 2-1, an air heat exchanger 2-2, a confluence valve 2-3, a heat storage tank 2-4, a thermoelectric power generation device 2-5, a cooler 2-6, a DC combiner box 2-7, a DC/AC converter 2-8, and an air cooling tower 2-9; wherein an outlet of the FLiBe-FLiNaK residual heat removal heat exchanger 1-10 is connected to an inlet of the diverter valve 2-1, a first outlet of the diverter valve 2-1 is connected to a hot side inlet of the air heat exchanger 2-2, a hot side outlet of the air heat exchanger 2-2 is connected to a first inlet of the confluence valve 2-3, an outlet of the confluence valve 2-3 is connected to the inlet of the FLiBe-FLiNaK residual heat removal heat exchanger 1-10, and a second outlet of the diverter valve 2-1 is connected to an inlet of the heat storage tank 2-4, an outlet of the heat storage tank 2-4 is connected to a second inlet of the confluence valve 2-3, an output end of the thermoelectric generator 2-5 is connected to an input end of the DC combiner box 2-7, an output end of the DC combiner box 2-7 is connected to an input end of the DC/AC converter 2-8, and an output end of the DC/AC converter 2-8 is connected to an input end of the thermoelectric generator 2-5, a hot end of the thermoelectric power generation device 2-5 is connected to the heat storage tank 2-4; a cold end of the thermoelectric power generation device 2-5 is connected to the cooler 2-6; a cold inlet of the air heat exchanger 2-2 and an inlet of the cooler 2-6 are connected to an inlet of the air cooling tower 2-9; and a cold outlet of the air heat exchanger 2-2 and an outlet of the outlet of the cooler 2-6 are connected to an outlet of the air cooling tower 2-9; and wherein a working process of the multipurpose passive residual heat removal system 2 is as follows: the FLiNaK molten salt is heated by the FLiBe-FLiNaK residual heat removal heat exchanger 1-10 and then driven by buoyancy into the diverter valve 2-1 for diversion: wherein a first part of the FLiNaK molten salt enters the air heat exchanger 2-2, the FLiNaK molten salt is cooled by the air and flows out of the air heat exchanger 2-2, and then enters the confluence valve 2-3; a second part of the FLiNaK molten salt enters the heat storage tank 2-4, the FLiNaK molten salt transfers heat from the heat storage tank 2-4 to the thermoelectric power generation device 2-5, then flows out of the heat storage tank 2-4, and then enters the confluence valve 2-3, the FLiNaK molten salts comes from the air heat exchanger 2-2 and the heat storage tank 2-4 converge at the confluence valve 2-3 and enter the FLiNaK residual heat removal heat exchanger 1-10 to be heated again to form a cycle; the high-temperature molten salt in the heat storage tank 2-4 conducts heat conduction to the hot end of the thermoelectric power generation device 2-5, so as to provide a stable heat source, and the cooler 2-6 decreases a temperature of a cold end of the thermoelectric power generation device 2-5, and provides a stable cold source; the hot end and the cold end of the thermoelectric power generation device 2-5 form a stable high temperature difference, and DC power is continuously generated under the action of the Seebeck effect; the DC power outputted by the thermoelectric power generation device 2-5 enters the DC combiner box 2-7, and is converted into AC power with stable voltage and frequency through the DC/AC converter 2-8.

Preferably, the coolant of the reactor body system 1 adopts FLiBe molten salt, a temperature of the core inlet is 650° C., a temperature of the core outlet is 700° C., and a thermal power of the core 1-3 is 125 MW.

Preferably, the core 1-3 of the reactor body system 1 adopts helical cruciform fuel elements, wherein TRISO nuclear fuel particles are randomly dispersed on the helical cruciform graphite matrix element with a filling rate of 50%, and each fuel rod element is in a single component arranged in a triangle, the components are arranged in a triangle.

Preferably, the reactor vessel 1-1 of the reactor body system 1 has a height of not more than 9 meters and a diameter of not more than 3.5 meters.

Preferably, a working fluid of the multipurpose passive residual heat removal system 2 is the FLiNaK molten salt, a temperature range of the molten salt is at a range of 500-650° C., and a minimum temperature of the cycle is higher than a freezing point thereof.

Preferably, a cooling medium for cooling the air heat exchanger 2-2 in the multipurpose passive residual heat removal system 2 is normal temperature air entering from a bottom inlet of the air cooling tower 2-9.

Preferably, wherein the thermoelectric power generation device 2-5 of the multipurpose passive residual heat removal system 2 is formed by alternately connecting a plurality of P-type and N-type semiconductors in series, and the material is a GeTe—AgSbTe2 medium-high temperature thermoelectric material.

Preferably, a cooling medium of the cooler 2-6 for cooling the cold end of the thermoelectric power generation device 2-5 in the multipurpose passive residual heat removal system 2 is the normal temperature entering from the bottom inlet of the air cooling tower 2-9.

Preferably, the diverter valve 2-1 and the confluence valve 2-3 in the multipurpose passive residual heat removal system 2 is electrically controlled and adjusted, and under different working conditions of the reactor body system 1, a mass flow rate of the molten salt flowing to the heat exchanger 2-2 and the heat storage tank 2-4 is adjusted according to demand.

Compared with the conventional arts, the present invention has beneficial effects as follows.

1. Under the normal operation of the reactor, the residual heat in the passive residual heat removal system can be efficiently recovered and utilized to generate electricity. Through the high temperature molten salt in the intermediate circuit of the remaining row and the normal temperature air in the air circuit of the air cooling tower, a stable high temperature difference is formed between the hot end and the cold end of the thermoelectric power generation device, and electricity is continuously generated. The output DC power enters the DC combiner box, and passes through the DC/AC converters convert DC power into AC power with stable voltage and frequency for use by other devices. The present invention is simple, safe and efficient in improving the efficiency of energy utilization.

2. The reactor uses FLiBe molten salt as the coolant, which has the advantages of high temperature and low pressure, waterless cooling and compact size. The boiling point of FLiBe molten salt exceeds 1000° C., the freezing point is lower than 500° C., and the normal pressure operation reduces the probability of reactor accidents. FLiBe molten salt has good heat-carrying performance. Compared with liquid lead-bismuth alloy, liquid metal sodium and helium, in the same coolant, the system of the present invention can take away more heat under the volume, which is conducive to the miniaturization of the reactor.

3. High inherent security. The reactor fuel element adopts the helical cruciform type, which can enhance the turbidity of the coolant between the channels and thus enhance the heat exchange. The failure temperature of the TRISO nuclear fuel dispersed in the graphite matrix is higher than 1600° C. The three natural circulation loops of the primary loop of the core, the intermediate loop of the remaining rows and the air loop of the air cooling tower are coupled to ensure the passive safety of the reactor.

4. In the event of an emergency power failure and accident conditions of the reactor, a mass flow rate of molten salt distributed to the air heat exchanger and the heat storage tank can be adjusted in time, which not only effectively takes away the heat of the core through natural circulation, but also can generate electricity through the thermoelectric power generation device. The power plant provides emergency power.

BRIEF DESCRIPTION OF THE DRAWINGS

FIG. 1 is a schematic diagram of the multipurpose passive residual heat removal system of a small fluoride-salt-cooled high-temperature reactor of the present invention.

In the FIGURE:
1—reactor body system
1-1: reactor vessel; 1-2: molten salt cold pool; 1-3: core; 1-4: core axial reflector; 1-5: core radial reflector; 1-6: cold/hot pool coaming; 1-7: molten salt hot pool; 1-8: axial flow pump; 1-9: FLiBe-FLiNaK primary heat exchanger; 1-10: FLiBe-FLiNaK residual heat removal heat exchanger; 1-11: control rod and drive mechanism
2—Multipurpose passive residual heat removal system
2-1: diverter valve (1 refers to a first outlet, 2 refers to a second outlet); 2-2: air heat exchanger; 2-3: convergence valve (1 refers to a first inlet, 2 refers to the second inlet); 2-4: thermal storage tank; 2-5: thermoelectric power generation device; 2-6: cooler; 2-7: DC combiner box; 2-8: DC/AC converter; 2-9: air cooling tower

DETAILED DESCRIPTION OF THE PREFERRED EMBODIMENT

The present invention provides a multipurpose passive residual heat removal system for a small fluoride-salt-cooled high-temperature reactor, which is illustrated in detail accompanying with the FIG. 1.

Referring to FIG. 1, a multipurpose passive residual heat removal system for a small fluoride-salt-cooled high-temperature reactor, comprises: a reactor body system 1 and a multipurpose passive residual heat removal system 2;

wherein the reactor body system 1, which serves as a heat source for the temperature reactor, comprises: a reactor vessel 1-1, a molten salt cold pool 1-2, a core 1-3, core axial reflectors 1-4, a core radial reflector 1-5, a cold/hot pool coaming 1-6, a molten salt hot pool 1-7, an axial flow pump 1-8, an FLiBe-FLiNaK primary heat exchanger 1-9, an FLiBe-FLiNaK residual heat removal heat exchanger 1-10 and a control rod and drive mechanism 1-11; wherein the FLiBe-FLiNaK primary heat exchanger 1-9 and the FLiBe-FLiNaK residual heat removal heat exchanger 1-10 are provided on an up part in the reactor vessel 1-1; the axial flow pump 1-8 is provided below the FLiBe-FLiNaK primary heat exchanger 1-9; the control rod and the drive mechanism 1-11 are provided on a top of the core active zone 1-3; the cold/hot pool coaming 1-6 is provided outside the core radial reflector 1-5, and separates a an interior of the reactor vessel 1-1 into the molten salt cold pool 1-2 and the molten salt hot pool 1-7; the core radial reflector 1-5 is axially provided on the core of the core; and the core axial reflectors 1-4 are respectively provided on an upper portion and a lower portion of the core 1-3;

the multipurpose passive residual heat removal system 2, as a special safety facility for the multipurpose passive residual heat removal system of a small fluorine salt-cooled high temperature reactor, shares the FLiBe-FLiNaK residual heat removal heat exchanger 1-10 with the reactor body system 1, and further comprises a diverter valve 2-1, an air heat exchanger 2-2, a confluence valve 2-3, a heat storage tank 2-4, a thermoelectric power generation device 2-5, a cooler 2-6, a DC combiner box 2-7, a DC/AC converter 2-8, an air cooling tower 2-9; wherein the FLiBe-FLiNaK residual heat removal heat exchanger 1-10 outlet is connected to the inlet of the diverter valve 2-1, the first outlet of the diverter valve 2-1 is connected to the hot side inlet of the air heat exchanger 2-2, the hot side outlet of the air heat exchanger 2-2 is connected to the first inlet of the confluence valve 2-3, the outlet of the confluence valve 2-3 is connected to the inlet of the FLiBe-FLiNaK residual heat removal heat exchanger 1-10, and the second outlet of the diverter valve 2-1 is connected to the storage The inlet of the heat tank 2-4 is connected to the inlet of the heat storage tank 2-4, the outlet of the heat storage tank 2-4 is connected to the second inlet of the confluence valve 2-3, the output end of the thermoelectric generator 2-5 is connected to the DC combiner box 2-7. is connected to the input end, the output end of the DC combiner box 2-7 is connected to the input end of the DC/AC converter 2-8, and the output end of the DC/AC converter 2-8 is connected to an input end of the thermoelectric generator 2-5, a hot end of the thermoelectric power generation device 2-5 is connected to the heat storage tank 2-4; a cold end of the thermoelectric power generation device 2-5 is connected to the cooler 2-6; a cold inlet of the air heat exchanger 2-2 and an inlet of the cooler 2-6 are connected to an inlet of the air cooling tower 2-9; and a cold outlet of the air heat exchanger 2-2 and an outlet of the outlet of the cooler 2-6 are connected to an outlet of the air cooling tower 2-9.

According to a preferred embodiment of the present invention, the coolant of the reactor body system 1 adopts FLiBe molten salt, a temperature of the core inlet is 650° C., a temperature of the core outlet is 700° C., and a thermal power of the core 1-3 is 125 MW.

According to a preferred embodiment of the present invention, the core 1-3 of the reactor body system 1 adopts helical cruciform fuel elements, wherein TRISO nuclear fuel particles are randomly dispersed on the helical cruciform graphite matrix element with a filling rate of 50%, and each fuel rod element is in a single component arranged in a triangle, the components are arranged in a triangle.

According to a preferred embodiment of the present invention, the reactor vessel 1-1 of the reactor body system 1 has a height of not more than 9 meters and a diameter of not more than 3.5 meters.

According to a preferred embodiment of the present invention, a working fluid of the multipurpose passive residual heat removal system 2 is the FLiNaK molten salt, a temperature range of the molten salt is at a range of 500-650° C., and a minimum temperature of the cycle is higher than a freezing point thereof.

According to a preferred embodiment of the present invention, a cooling medium for cooling the air heat exchanger 2-2 in the multipurpose passive residual heat removal system 2 is normal temperature air entering from a bottom inlet of the air cooling tower 2-9.

According to a preferred embodiment of the present invention, wherein the thermoelectric power generation device 2-5 of the multipurpose passive residual heat removal system 2 is formed by alternately connecting a plurality of P-type and N-type semiconductors in series, and the material is a GeTe—AgSbTe2 medium-high temperature thermoelectric material.

According to a preferred embodiment of the present invention, a cooling medium of the cooler 2-6 for cooling the cold end of the thermoelectric power generation device 2-5 in the multipurpose passive residual heat removal system 2 is the normal temperature entering from the bottom inlet of the air cooling tower 2-9.

According to a preferred embodiment of the present invention, the diverter valve 2-1 and the confluence valve 2-3 in the multipurpose passive residual heat removal system 2 is electrically controlled and adjusted, and under different working conditions of the reactor body system 1, a flow rate of the molten salt flowing to the heat exchanger 2-2 and the heat storage tank 2-4 is adjusted according to demand.

A working process of the reactor body system 1 is as follows: when the reactor body system 1 is in a normal operation, after transmitting by the axial flow pump 1-8, the FLiBe molten salt coolant is collected in the molten salt cold pool 1-2, then deflect upwards, enter the core active zone 1-3 from the bottom of the core axial reflector 1-4 to absorb heat, and then collect in the molten salt hot pool 1-7 and flows downward from a top and enters the FLiBe-FLiNaK primary heat exchanger 1-9 and the FLiBe-FLiNaK residual heat removal heat exchanger 1-10 respectively, and the FLiBe-FLiNaK primary heat exchanger 1-9 goes to the secondary circuit, the system releases heat, and the FLiBe-FLiNaK residual heat removal heat exchanger 1-10 releases heat to the multipurpose passive residual heat removal system 2, and finally the coolant flowing through the FLiBe-FLiNaK primary heat exchanger 1-9 is regenerated; enter the axial flow pump 1-8 to pressurize to complete the forced circulation of the coolant, and the coolant flowing through the FLiBe-FLiNaK residual heat removal heat exchanger 1-10 directly enters the molten salt cold pool 1-10 at the bottom of the reactor vessel; complete the natural circulation of the coolant; in the reactor shutdown and accident conditions, the coolant working process in the reactor body system 1 is the same as the forced circulation mode, except that the axial flow pump 1-8 does not work, but uses the driving force provided by the density difference between the cold fluid in the area of the FLiBe-FLiNaK removal heat exchanger 1-10 and the hot fluid in the core area completes the natural circulation of the coolant.

A working process of the multipurpose passive residual heat removal system 2 is as follows: the FLiNaK molten salt is heated by the FLiBe-FLiNaK residual heat removal heat exchanger 1-10 and then driven by buoyancy into the diverter valve 2-1 for diversion: wherein a first part of the FLiNaK molten salt enters the air heat exchanger 2-2, the FLiNaK molten salt is cooled by the air and flows out of the air heat exchanger 2-2, and then enters the confluence valve 2-3; a second part of the FLiNaK molten salt enters the heat storage tank 2-4, the FLiNaK molten salt transfers heat from the heat storage tank 2-4 to the thermoelectric power generation device 2-5, then flows out of the heat storage tank 2-4, and then enters the confluence valve 2-3, the FLiNaK molten salts comes from the air heat exchanger 2-2 and the heat storage tank 2-4 converge at the confluence valve 2-3 and enter the FLiNaK residual heat removal heat exchanger 1-10 to be heated again to form a cycle; the high-temperature molten salt in the heat storage tank 2-4 conducts heat conduction to the hot end of the thermoelectric power generation device 2-5, so as to provide a stable heat source, and the cooler 2-6 decreases a temperature of a cold end of the thermoelectric power generation device 2-5, and provides a stable cold source; the hot end and the cold end of the thermoelectric power generation device 2-5 form a stable high temperature difference, and DC power is continuously generated under the action of the Seebeck effect; the DC power outputted by the thermoelectric power generation device 2-5 enters the DC combiner box 2-7, and is converted into AC power with stable voltage and frequency through the DC/AC converter 2-8.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A multipurpose passive residual heat removal system for a small fluoride-salt-cooled high-temperature reactor, comprising:
   a reactor body system, comprising:
   a cylindrical reactor vessel,
   a molten salt cold pool and a molten salt hot pool,
   a core,
   core axial reflectors positioned above and below the core,
   a core radial reflector positioned radially outside the core,
   a cold/hot pool coaming positioned radially outside of the core radial reflector and separating an interior of the reactor vessel into the molten salt cold pool and the molten salt hot pool,
   an axial flow pump,
   a FLiBe-FLiNaK primary heat exchanger, and a FLiBe-FLiNaK residual heat removal heat exchanger both provided in an upper portion of the reactor vessel with the primary heat exchanger positioned above the axial flow pump, and
   a control rod and drive mechanism; at a top of the core;
   wherein the multipurpose passive residual heat removal system comprises:
   a diverter valve comprising an inlet connected to an outlet of the FLiBe-FLiNaK residual heat removal heat exchanger,
   an air heat exchanger comprising a hot side inlet connected to a first outlet of the diverter valve,
   a confluence valve comprising a first inlet connected to a hot side outlet of the air heat exchanger,
   a heat storage tank comprising an inlet connected to a second outlet of the diverter valve and an outlet connected to a second inlet of the confluence valve,
   a thermoelectric power generation device; configured to receive heat from the heat storage tank and convert the heat into electrons, the thermoelectric power generation device connected in series with a DC combiner box and a DC/AC converter, a cooler configured to cool the thermoelectric power generation device, and an air cooling tower; having an inlet connected to an inlet of the air heat exchanger and an inlet of the cooler and an outlet connected to an outlet of the air heat exchanger and an outlet of the cooler.

2. The multipurpose passive residual heat removal system for a small fluoride-salt-cooled high-temperature reactor, as recited in claim 1, wherein the reactor body system further comprises a FLiBe molten salt coolant, and wherein a temperature of a core inlet temperature of the reactor body system is 650° C., core outlet temperature is 700° C., and a thermal power is 125 MW.

3. The multipurpose passive residual heat removal system for a small fluoride-salt-cooled high-temperature reactor, as recited in claim 1, wherein the core comprises helical cruciform fuel elements, comprising TRISO nuclear fuel particles randomly dispersed in a graphite matrix.

4. The multipurpose passive residual heat removal system for a small fluoride-salt-cooled high-temperature reactor, as recited in claim 1, wherein the reactor vessel has a height of not more than 9 meters and a diameter of not more than 3.5 meters.

5. The multipurpose passive residual heat removal system for a small fluoride-salt-cooled high-temperature reactor, as recited in claim 1, wherein a working fluid of the multipurpose passive residual heat removal system is a FLiNaK molten salt, wherein a working temperature range of the molten salt is in a range of 500-650° C.

6. The multipurpose passive residual heat removal system for a small fluoride-salt-cooled high-temperature reactor, as recited in claim 1, wherein a cooling medium for cooling the air heat exchanger in the multipurpose passive residual heat removal system ambient air entering from a bottom inlet of the air cooling tower.

7. The multipurpose passive residual heat removal system for a small fluoride-salt-cooled high-temperature reactor, as recited in claim 1, wherein the thermoelectric power generation device comprises a plurality of P-type and N-type semiconductors comprising GeTe-AgSbTe, connected in series.

8. The multipurpose passive residual heat removal system for a small fluoride-salt-cooled high-temperature reactor, as recited in claim 1, wherein a cooling medium of the cooler for cooling the thermoelectric power generation device is ambient air entering from a bottom inlet of the air cooling tower.

9. The multipurpose passive residual heat removal system for a small fluoride-salt-cooled high-temperature reactor, as recited in claim 1, wherein the diverter valve and the confluence valve are electrically controlled and configured to adjust a flow rate of a working fluid molten salt flowing to the heat exchanger and the heat storage tank according to demand.

* * * * *